United States Patent [19]

Ozaki et al.

[11] Patent Number: 5,606,524

[45] Date of Patent: Feb. 25, 1997

[54] NON-VOLATILE SEMICONDUCTOR MEMORY DEVICE CAPABLE OF EFFECTING HIGH-SPEED OPERATION WITH LOW VOLTAGE

[75] Inventors: Kouji Ozaki, Yokohama; Kazuhiko Miki, Kawasaki, both of Japan

[73] Assignee: Kabushiki Kaisha Toshiba, Kawasaki, Japan

[21] Appl. No.: 604,830

[22] Filed: Feb. 22, 1996

[30] Foreign Application Priority Data

Feb. 24, 1995 [JP] Japan ..................................... 7-036737

[51] Int. Cl.$^6$ ................................................... G11C 11/34
[52] U.S. Cl. .............................. 365/185.23; 365/189.09; 365/233; 365/203
[58] Field of Search ......................... 365/185.23, 189.09, 365/189.11, 233, 203, 189.01

[56] References Cited

U.S. PATENT DOCUMENTS 5,335,205  8/1994  Ogihara ............................ 365/189.09
5,521,817  5/1996  Choi ................................. 365/189.09

FOREIGN PATENT DOCUMENTS 6-223589  8/1994  Japan.

Primary Examiner—David C. Nelms
Assistant Examiner—Vu A. Le
Attorney, Agent, or Firm—Finnegan, Henderson, Farabow, Garrett & Dunner, L.L.P.

[57] ABSTRACT

A non-volatile semiconductor memory device raises the word line voltage by use of the edge of a clock to read out memory cell data. A plurality of voltage raising circuits are connected in parallel and each of the voltage raising circuits raises a power supply voltage. A level shifter is connected to the outputs of the plurality of voltage raising circuits to drive the word line. Driving means drives each of the plurality of voltage raising circuits by use of clocks each having only one edge in a period from the address changing time to the memory cell data readout starting time at which the precharging operation is terminated. The clocks for driving the voltage raising circuits have a phase difference with respect to one another for the respective voltage raising circuits.

2 Claims, 5 Drawing Sheets

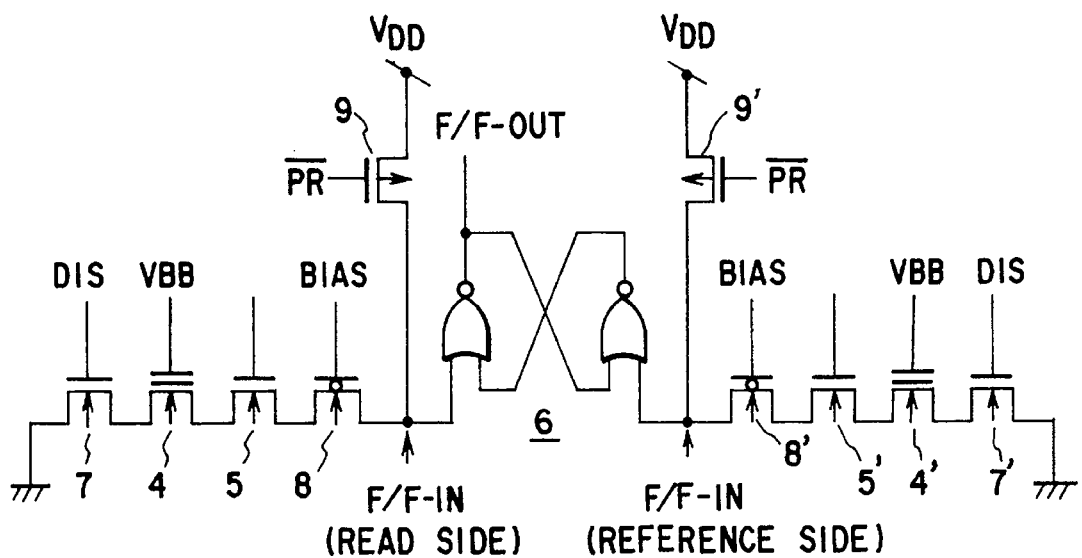
F I G. 2
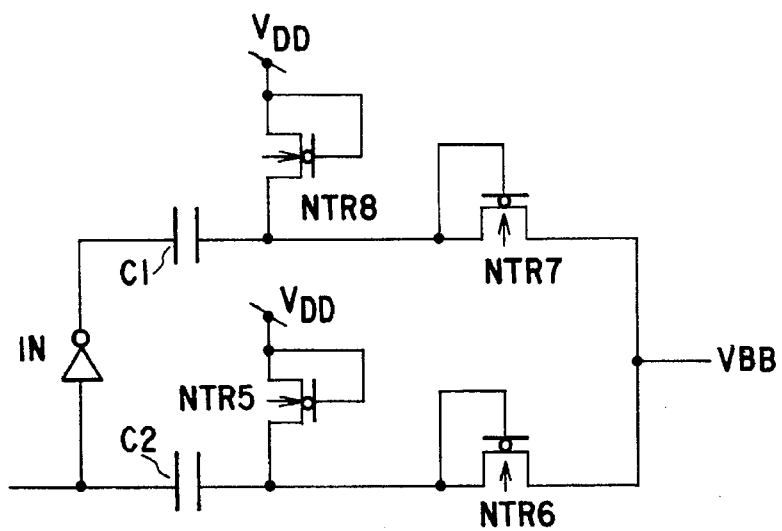
F I G. 3
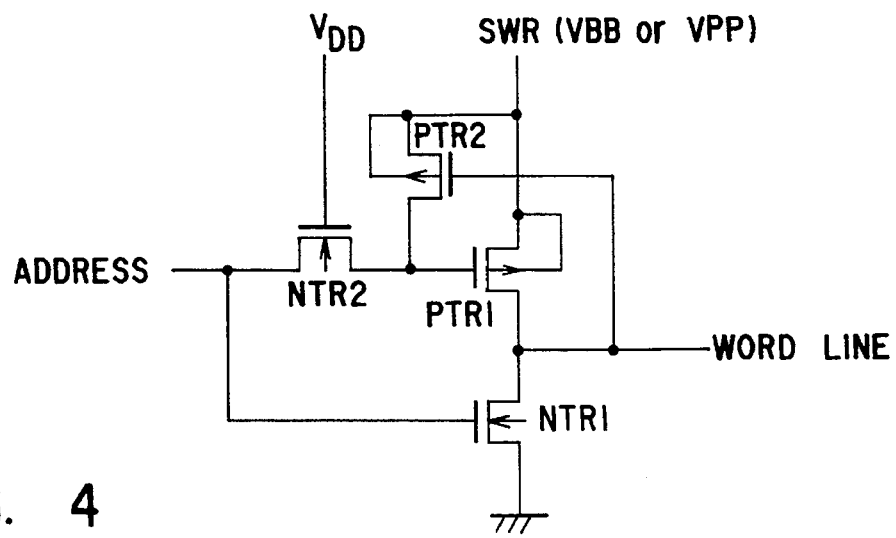
F I G. 4

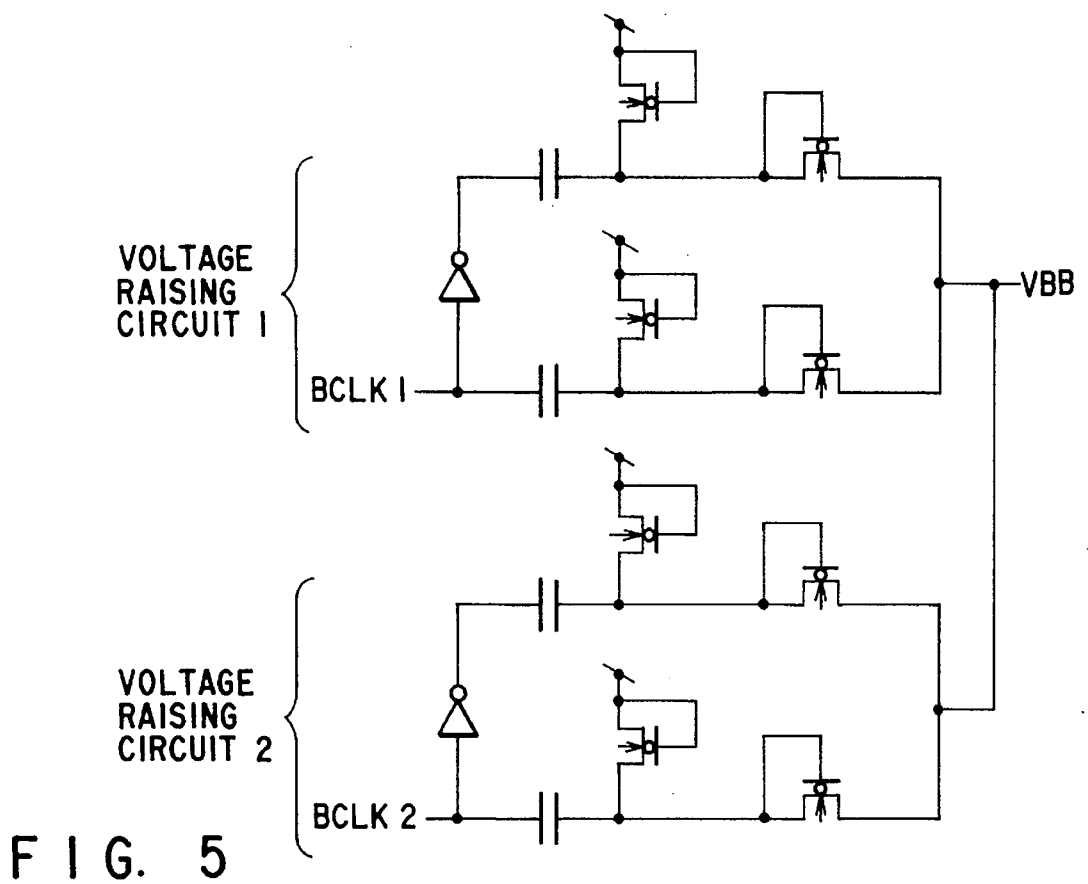
F I G. 5
F I G. 6A ADDRESS
F I G. 6B $\overline{PR}$
F I G. 6C BCLK
F I G. 6D VBB
F I G. 6E F/F-IN

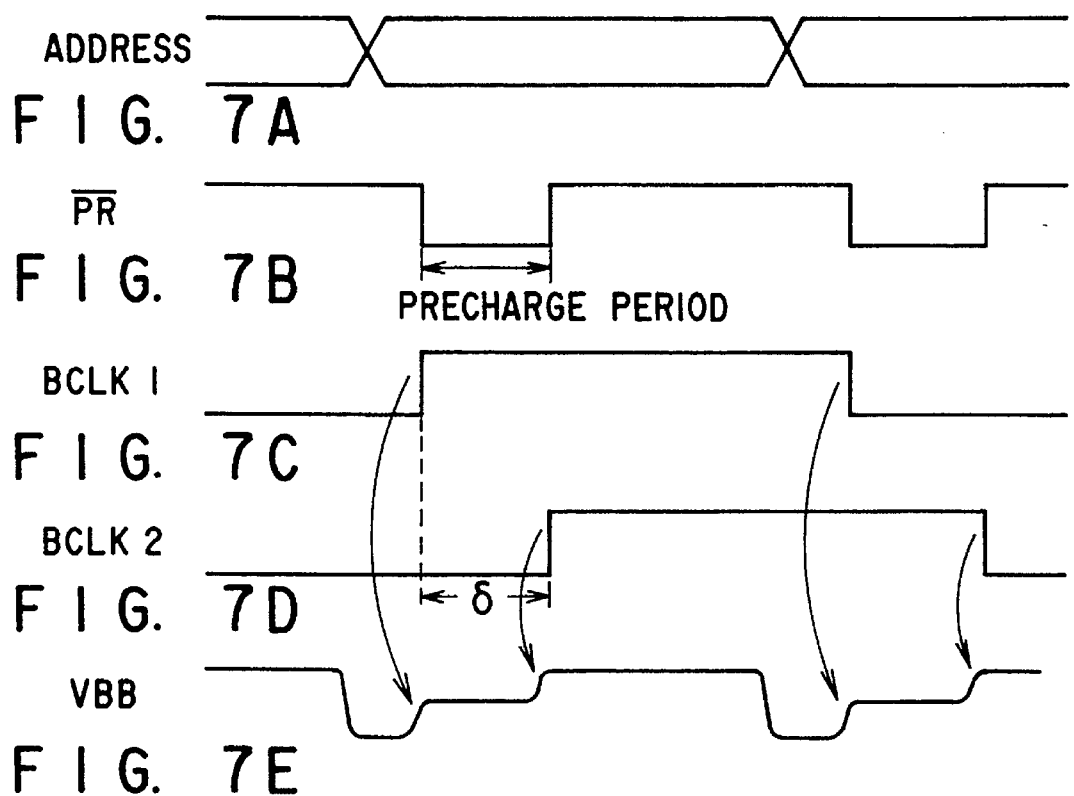
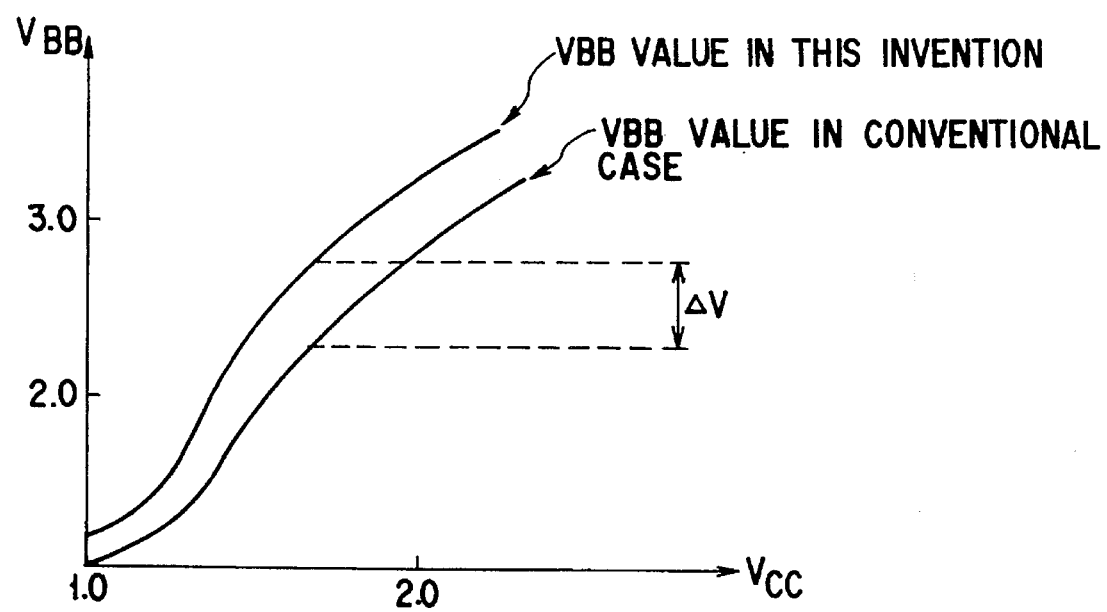

FIG. 9A
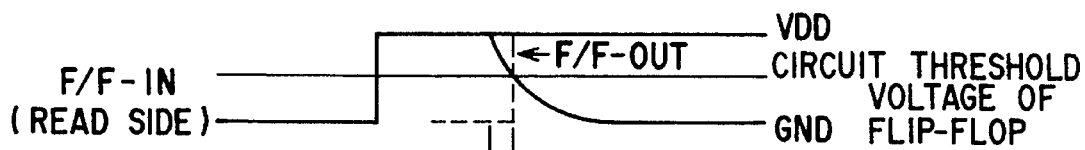
FIG. 9B
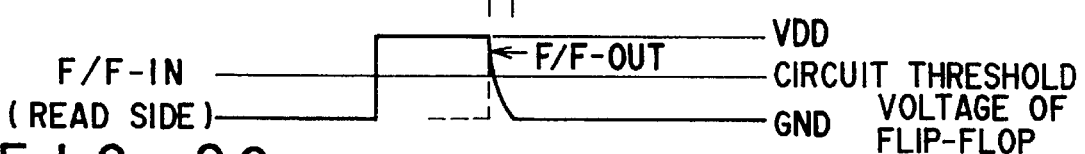
FIG. 9C
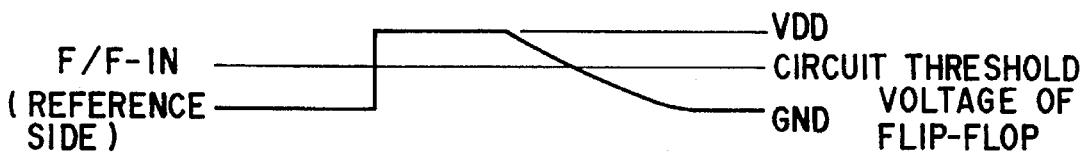
FIG. 9D
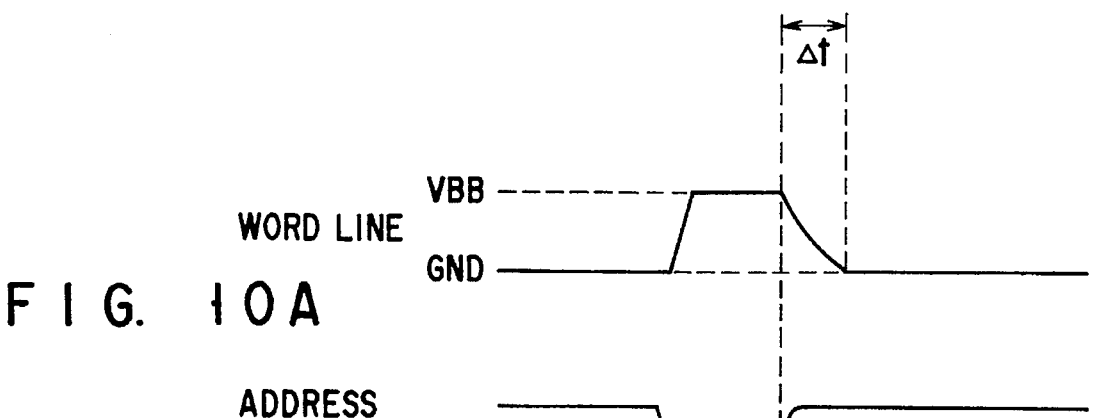
FIG. 10A
FIG. 10B

NON-VOLATILE SEMICONDUCTOR MEMORY DEVICE CAPABLE OF EFFECTING HIGH-SPEED OPERATION WITH LOW VOLTAGE

BACKGROUND OF THE INVENTION

1. Field of the Invention

This invention relates to a non-volatile semiconductor memory device, and more particularly to a non-volatile semiconductor memory device of precharge/discharge type for driving word lines by use of a voltage raising circuit to read out data and used for a memory device which is required to be operated at a high speed with a low voltage.

2. Description of the Related Art

Conventionally, a non-volatile semiconductor memory device of precharge/discharge type such as an EPROM for reading out data by a raised word line voltage is known. In such a non-volatile semiconductor memory device, as shown in FIGS. 6A to 6E, the voltage raising (pump-up) operation of a voltage raising (charge pump) circuit shown in FIG. 3 is effected only in a precharge period (in which PR is set at an "L" level) so as to reduce the number of voltage raising operations and reduce unnecessary current consumption in the voltage raising circuit.

Further, since a drop or lowering in the raised potential caused by a through current in the level shifter at the time of address change can be efficiently compensated by pump-up operation in the later stage, a low-voltage operation in which the power supply voltage of approx. 2 V or less is used is realized.

However, if the power supply voltage is further lowered, the charging speed for voltage raising capacitors C1, C2 is abruptly lowered, and the effective charging time of the voltage raising capacitors C1, C2 is reduced by the dull portion of a voltage raising clock, and therefore, the current supplying ability of the voltage raising circuit is extremely lowered. This becomes significant in the high-speed operation, a drop or lowering in the raised potential by an address change is large and the restoring operation in the later stage is delayed. That is, since the data readout operation is started before a raised voltage level which permits the high-speed readout operation is obtained, it is difficult to effect the high-speed readout operation with a power supply voltage of 2 V or less.

The readout speed in the precharge/discharge type using a flip-flop sense amplifier of FIG. 2 depends on the current driving ability of a group of transistor (transistors serially connected to the bit line, that is, column selectors, memory cells and the like) for discharging the input (F/F-IN) of the precharged flip-flop sense amplifier, that is, the threshold voltages and gate voltages of the transistors. More specifically, in order to make it possible to effect the high-speed readout operation with a voltage of 2 V or less, the level change in the input (F/F-IN) voltage of the flip-flop sense amplifier of FIG. 2 is made sharp so as to permit the threshold voltage of the flip-flop sense amplifier to be rapidly exceeded. In order to rapidly lower the F/F-In level from VDD to GND, it is necessary to enhance the current driving ability of a memory cell having the highest threshold voltage among a group of transistors serially connected to the bit line, and the raised voltage level may be set as high as possible to meet the above requirement. Thus, since an output of the flip-flop sense amplifier can be obtained at an earlier time by Δs shown in FIGS. 9B, 9C, a still higher speed operation can be effected.

However, there is a limitation to the degree by which the raised voltage level is raised by operating the voltage raising circuit of FIG. 3 as indicated by FIGS. 6A to 6E and a sufficiently high voltage raising ability cannot be attained under the circumstance in which the high-speed readout operation with a low voltage is required.

Further, since the dull portion of the voltage raising clock largely depends on the threshold voltage of MOS transistors constructing a clock creating circuit, there occurs a problem that the current supplying ability of the voltage raising circuit is influenced by a fluctuation in the process condition and it is difficult to stably attain the low-voltage operation ensuring margin.

Further, in a level shifter which consumes charges charged by the voltage raising operation, a problem occurs at the time of low-voltage operation or when variations in the threshold values of transistors constructing the same are large. For example, in the level shifter shown in FIG. 4, assuming that the threshold voltage of PTR1 is low and the threshold voltage of NTR1 is high, it is necessary to turn ON NTR1 and turn OFF PTR1 when the potential level of the word line is changed from "H" to "L".

However, since the threshold voltage of NTR1 is high, it is difficult to turn ON NTR1 so that the GND level will be difficult to be transmitted to the word line, and as a result, PTR2 which permits the potential level of the word line to act as a feedback voltage becomes difficult to be turned ON, and therefore, PTR1 whose threshold voltage is originally low becomes more difficult to be turned OFF. For this reason, as shown in FIGS. 10A, 10B, since Δt becomes longer with a reduction in the operation voltage and a through current is permitted to flow during this period, a voltage output to the word line at the readout time is further lowered.

SUMMARY OF THE INVENTION

Accordingly, an object of this invention is to provide a non-volatile semiconductor memory device capable of suppressing a lowering in the raised voltage and enhancing the voltage raising efficiency with the same power consumption as in the conventional case, even when the high-speed readout operation with the low operation voltage is required.

In order to attain the above object, this invention provides a non-volatile semiconductor memory device of precharge/discharge type for raising the word line voltage by use of the edge of a clock to read out memory cell data, comprising a plurality of voltage raising circuits connected in parallel, for raising the power supply voltage; a level shifter connected to the outputs of the plurality of voltage raising circuits to drive word lines; and driving means for driving the plurality of voltage raising circuits by clocks each having only one edge in a period from the address changing time to the memory cell data readout starting time at which the precharging operation is terminated. The clocks for driving the respective voltage raising circuits have a phase difference with respect to one another for the respective voltage raising circuits.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a circuit diagram showing the construction of a readout circuit in the non-volatile semiconductor memory device according to this embodiment;

FIG. 3 is a circuit diagram showing the construction of a voltage raising circuit for raising the word line voltage;

FIG. 4 is a circuit diagram showing the construction of a level shifter circuit used in this embodiment;

FIG. 5 is a circuit diagram showing the construction of a parallel-connection circuit of two voltage raising circuits according to this embodiment;

FIGS. 6A to 6E are time charts for illustrating the operation sequence by a conventional voltage raising circuit;

FIGS. 7A to 7E are time charts for illustrating the operation sequence by a voltage raising circuit according to this embodiment;

FIG. 8 is a graph showing the VCC/VBB characteristic of this embodiment in comparison with that of the conventional case;

FIGS. 9A to 9D are diagrams showing voltage variations in the input and output of the readout circuit shown in FIG. 2; and FIGS. 10A and 10B are diagrams showing level variations of the word line in the level shifter circuit of FIG. 4.

DETAILED DESCRIPTION OF THE PREFERRED EMBODIMENTS

Figure 1:
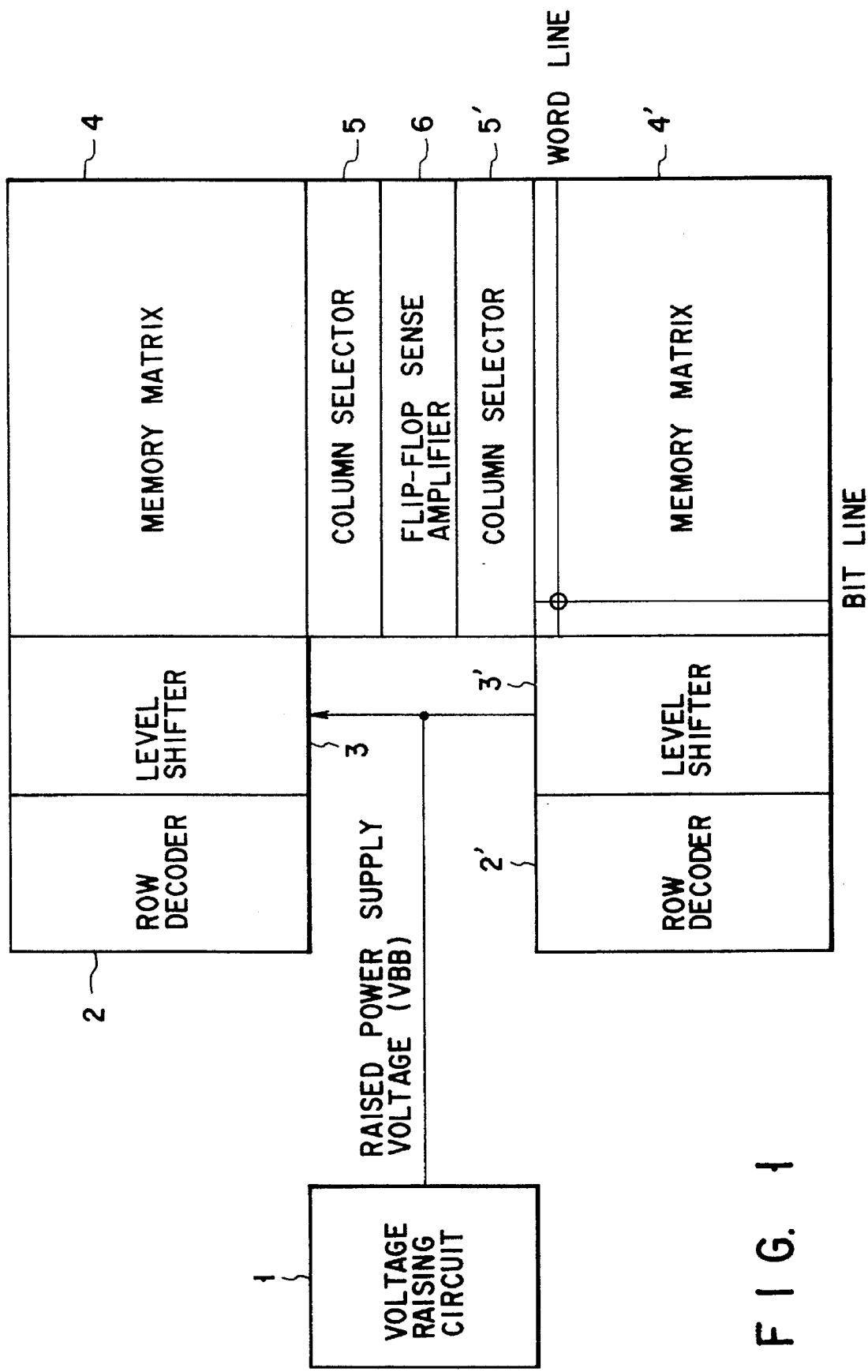
FIG. 1 is a schematic construction diagram of a non-volatile semiconductor memory device according to one embodiment of this invention.

First, an embodiment of this invention is schematically described. In this embodiment, in a non-volatile semiconductor memory device of word line voltage raising type mounted on a microcomputer or the like, a plurality of voltage raising circuits are connected in parallel and each of the voltage raising circuits is driven by a voltage raising clock having a phase difference for each voltage raising circuit and having only one edge in a period from the address changing time to the readout starting time. Therefore, the time for charging a plurality of voltage raising capacitors is made longer and uniform and the current driving ability of the voltage raising circuit is enhanced in comparison with a case wherein one voltage raising circuit effects the voltage raising operation by a plurality of times in a period from the address changing time to the readout starting time. Particularly, in the low voltage/high-speed readout operation, the degree of a lowering in the raised voltage level (VBB) by a through current flowing in the level shifter at the address changing time can be suppressed.

There will now be described an embodiment of this invention with reference to the accompanying drawings.

FIG. 1 is a schematic construction diagram of a non-volatile semiconductor memory device according to one embodiment of this invention. As shown in FIG. 1, the non-volatile semiconductor memory device of this embodiment includes memory matrices 4, 4', row decoders 2, 2', level shifters 3, 3' connected to the memory matrices 4, 4', column selectors 5, 5', a flip-flop sense amplifier 6, and a voltage raising circuit 1 connected to the level shifters 3, 3'.

FIG. 2 is a diagram showing the construction of a memory readout circuit for one bit in the memory matrix of FIG. 1. As shown in FIG. 2, the readout circuit includes a flip-flop sense amplifier 6, column selectors 5, 5', EPROMs 4, 4', precharge control transistors 9, 9', discharge control transistors 7, 7', and bias control intrinsic transistors 8, 8'.

In this example, the readout operation effected by using the EPROM 4 as a read cell, using the EPROM 4' as a reference cell and using the flip-flop sense amplifier is explained. A difference is made in the current driving abilities of the cells by making the word line width of the reference cell larger than that of the read cell. First, in the precharged state, the input (F/F-IN) of the flip-flop is set to the power supply voltage (VDD) level via the precharge control transistor 9 (9') and a voltage substantially equal to the bias voltage appears on the column selector 5 (5') side by means of the bias control transistor 8 (8'). Since the reference cell is used as a normally turned-ON cell (cell in which data is not written), as shown in the time chart of FIGS. 9A to 9D, the voltage in the precharged input (F/F-IN) varies such that the input voltage on the read side will exceed the circuit threshold voltage of the sense amplifier at earlier timing after start of the readout operation (completion of the precharging operation) and the output (F/F-OUT) is set to the "1" level if the read cell is set in the ON state. On the other hand, if the read cell is used as an OFF cell (cell in which data is written), the voltage of the input (F/F-IN) on the read side varies only by an amount of leak level and the output (F/F-OUT) is set to the "0" level when the voltage on the reference side exceeds the circuit threshold voltage.

The voltage raising circuit 1 is constructed by connecting two voltage raising circuits having the same construction as that shown in FIG. 3 in parallel as shown in FIG. 5. The two circuits have the same construction, but the circuits are respectively supplied with driving clocks BCLK1, BCLK2 having a phase difference from each other. As shown in FIG. 3, each of the voltage raising circuits includes capacitors C1, C2 charged by a voltage raising clock, a plurality of intrinsic transistors NTR5 to NTR8, and an inverter IN. The capacitor C2 is charged by the rise edge of the voltage raising clock input via the clock input terminal φ and the capacitor C1 is charged by the fall edge of the voltage raising clock so as to raise the power supply voltage VBB.

FIG. 4 is a diagram showing the construction of the level shifter 3 (3'). The level shifter includes a plurality of transistors NTR1, NTR2, PTR1, PTR2, and when the address is changed, the raised voltage output from the voltage raising circuit 1 causes a through current to flow into the ground. In FIG. 4, VBB is a voltage at a raised voltage level used at the readout time, and VPP is a voltage used at the write-in time.

The operation of the voltage raising circuit with the above construction is explained below.

FIGS. 7A to 7E are time charts indicating the operation sequence by a voltage raising circuit according to this embodiment, and the waveforms of an address signal, two voltage raising circuit driving clocks (BCLK1, BCLK2 in FIG. 5), readout control clock PR, and raised voltage VBB are shown in comparison with one another.

If one voltage raising clock input to one voltage raising circuit has a plurality of edges in the precharge period like the conventional case shown in FIGS. 6A to 6E, a period in which the voltage raising capacitor is charged by an edge other than the last edge becomes relatively short in comparison with a case wherein the last edge is used. This means that the effect which may be obtained by providing a plurality of edges in a precharge period to enhance the current driving ability and output voltage of the voltage raising circuit is reduced.

Therefore, in this embodiment, the voltage raising operation by the voltage raising circuits 1 and 2 is effected only one time in one precharge period to make the time of voltage raising process by the edge longer and the charging periods for a plurality of (two, in this example) voltage raising capacitors are made uniform to efficiently raise the voltage so that the current driving ability can be enhanced.

Further, as shown in FIGS. 7A to 7E, BCLK1, BCLK2 used as voltage raising circuit driving clocks are clocks having the same period and are set to have a preset phase difference δ. The address changing operation is easily influenced by the power supply voltage and the address changing time may be delayed and shifted into the precharge period when the low voltage operation is effected, but even in this case, if the above clocks are used, it becomes possible to ensure that at least one voltage raising operation is effected before the readout operation by the second clock BCLK2.

On the other hand, if the address is already changed before the readout operation, the period from the voltage raising operation starting time to the readout starting time is made as long as possible to efficiently raise the output VBB of the voltage raising circuit which is lowered by the address changing operation.

From the above reason, in this embodiment, the voltage raising operation is effected twice, at the starting time of precharging operation and at time immediately before completion of the precharging operation. In this case, the number of two times is set by taking it into consideration that it is sufficient to obtain a raised voltage level used for the readout operation and the operation effected by increasing the number of times is considered as an unwanted operation and increases the current consumption.

As described above, when the condition for lowering the operation voltage and realizing the high-speed operation is considered, a problem that the address changing timing is delayed and the dull portion of the clock becomes larger cannot be solved by the conventional method, but according to the method of this embodiment, since the voltage raising operation can be efficiently effected, the current supplying ability is enhanced, and as shown in FIG. 8, the raised voltage level is pulled up by ΔV (several V/10) in the range of VCC of 2 V or less. As a result, since the readout operation is effected by a sufficiently high gate voltage, the high-speed operation can be attained with a low operation voltage. Further, FIG. 8 is a graph showing the effect of this embodiment in comparison with the conventional case and formed based on experimental data.

In view of the power consumption, since the two voltage raising circuits (doublers) are connected in parallel and clocks having a phase difference are used, the number of voltage raising operations effected in one readout operation is the same as that of the conventional case and the power consumption is kept substantially unchanged.

According to this embodiment, even when the high-speed readout operation with the low operation voltage is required, the voltage raising efficiency can be enhanced while suppressing a lowering in the raised potential with the same power consumption as in the conventional case.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A non-volatile semiconductor memory device of precharge/discharge type for raising a word line voltage by use of an edge of a clock to read out memory cell data, comprising:

a plurality of voltage raising circuits connected in parallel, each for raising a power supply voltage;

a level shifter connected to the outputs of said plurality of voltage raising circuits to drive word lines; and driving means for driving each of said plurality of voltage raising circuits by use of clocks each having only one edge in a period from the address changing time to the memory cell data readout starting time at which the precharging operation is terminated.

2. A non-volatile semiconductor memory device according to claim 1, wherein the clocks for driving the respective voltage raising circuits have a phase difference with respect to one another for the respective voltage raising circuits.

* * * * *